United States Patent [19]

Goodman

[11] 4,207,122
[45] Jun. 10, 1980

[54] INFRA-RED LIGHT EMISSIVE DEVICES

[75] Inventor: Colin H. L. Goodman, Loughton, England

[73] Assignee: International Standard Electric Corporation, New York, N.Y.

[21] Appl. No.: 965,551

[22] Filed: Dec. 1, 1978

[51] Int. Cl.² ................ H01L 27/14; H01L 29/205; H01L 21/208
[52] U.S. Cl. ............................ 148/33.4; 29/569 L; 148/171; 148/175; 148/33.5; 331/94.5 H; 357/16; 357/18; 357/30; 357/61
[58] Field of Search .......................... 148/171–173, 148/33.4, 33.5, 175; 331/94.5 H; 357/16, 18, 30, 61; 29/569 L, 576 E

[56] References Cited
U.S. PATENT DOCUMENTS

| | | | |
|---|---|---|---|
| 3,614,549 | 10/1971 | Lorenz et al. ............... | 357/61 X |
| 3,696,262 | 10/1972 | Antypas ..................... | 148/171 X |
| 3,814,993 | 6/1974 | Kennedy .................... | 357/30 |
| 3,932,883 | 1/1976 | Rowland et al. ............ | 357/30 |
| 3,982,261 | 9/1976 | Antypas ..................... | 148/175 X |
| 3,983,509 | 9/1976 | Scifres et al. ............... | 331/94.5 H |
| 3,995,303 | 11/1976 | Nahory et al. .............. | 357/61 X |
| 4,015,284 | 3/1977 | Hara et al. .................. | 357/61 X |
| 4,032,951 | 6/1977 | De Winter et al. .......... | 357/61 X |
| 4,034,311 | 7/1977 | Itoh et al. ................... | 331/94.5 H |
| 4,075,654 | 2/1978 | Hara et al. .................. | 357/61 X |

OTHER PUBLICATIONS

Tietjen et al., "Vapor Phase Growth . . . III-V . . . Semiconductors", R.C.A. Review, Dec. 1970, pp. 635-646.

Primary Examiner—L. Dewayne Rutledge
Assistant Examiner—W. G. Saba
Attorney, Agent, or Firm—John T. O'Halloran; Peter C. Van Der Sluys

[57] ABSTRACT

In ($Sb_{0.1}As_{0.9}$) light emissive diodes and lasers are grown on Ga Sb substrates to give lattice matching. Ga Sb has higher band gap, high refractive index therefore gives electrical, but not optical, confinement required for laser action. Both confinement types provided by sandwiching active layer between layers of ($Al_{0.6}Ga_{0.4}$) Sb. In ($Sb_{0.1}As_{0.9}$) emits at approximately 4 μm, but emission can be shifted by increasing the proportion of In Sb and restoring the lattice match by the addition of another compound semiconductor e.g. Ga As for longer wavelength emission or In P or Al As for shorter wavelength emission.

8 Claims, 5 Drawing Figures

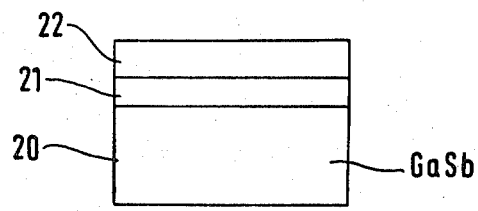
Fig. 2
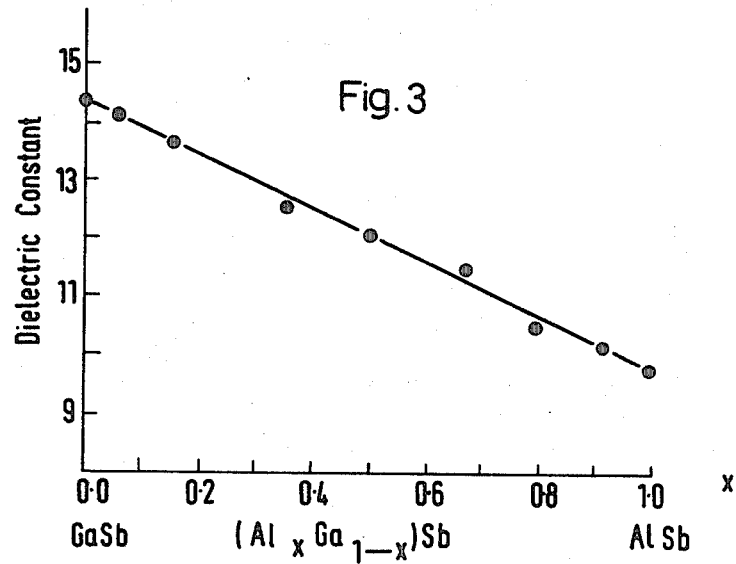
Fig. 3
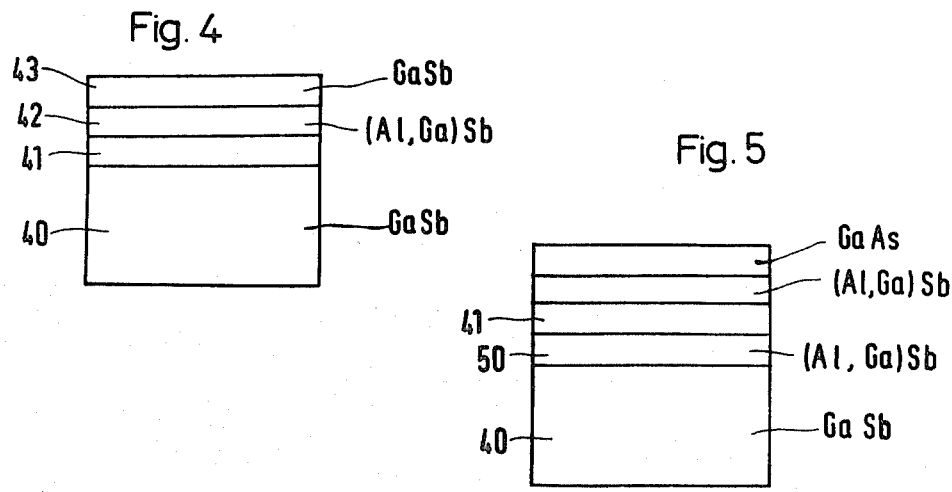
Fig. 4
Fig. 5

INFRA-RED LIGHT EMISSIVE DEVICES

BACKGROUND OF THE INVENTION

This invention relates to infra-red light emissive devices, and in particular to such devices having active light emissive regions of the ternary solid solution In(Sb, As) and related multicomponent (quaternary or higher) solid solutions.

Light emissive devices have been made that have had an active light emissive region of In(Sb, As) grown epitaxially upon an In As substrate. A problem with this type of construction is that the addition of In Sb to In As to form a solid solution has the effect of changing the lattice spacing. Therefore a graded interlayer was necessary between the active region and the substrate, but even this did not entirely remove the strain from the active region which was relatively heavily dislocated. The present invention is directed to the problem of lattice mismatch.

SUMMARY OF THE INVENTION

According to this invention there is provided an infra-red light emissive device having an active light emissive region of material of the ternary In(Sb, As) solid solution having a lattice spacing matched with that of Ga Sb, which material is epitaxially grown directly or indirectly upon a substrate of Ga Sb.

This invention also provides an infra-red light emissive device having an active light emissive region of material of a multicomponent, quaternary or higher, solid solution having a lattice spacing matched with that of Ga Sb and is based upon the ternary In(Sb, As) solid solution, which material is epitaxially grown directly or indirectly upon a substrate of Ga Sb.

BRIEF DESCRIPTION OF THE DRAWINGS

There follows a description of infra-red light emissive devices embodying this invention. The description refers to the accompanying drawings in which:

FIG. 2 depicts a schematic cross-section through a light emissive diode embodying this invention, FIG. 3 is a graph depicting the variation in dielectric constant of the (Al, Ga)Sb solid solution with composition, and FIGS. 4 and 5 depict schematic cross-sections through two further constructions of device embodying this invention.

DETAILED DESCRIPTION OF THE INVENTION

Figure 1:
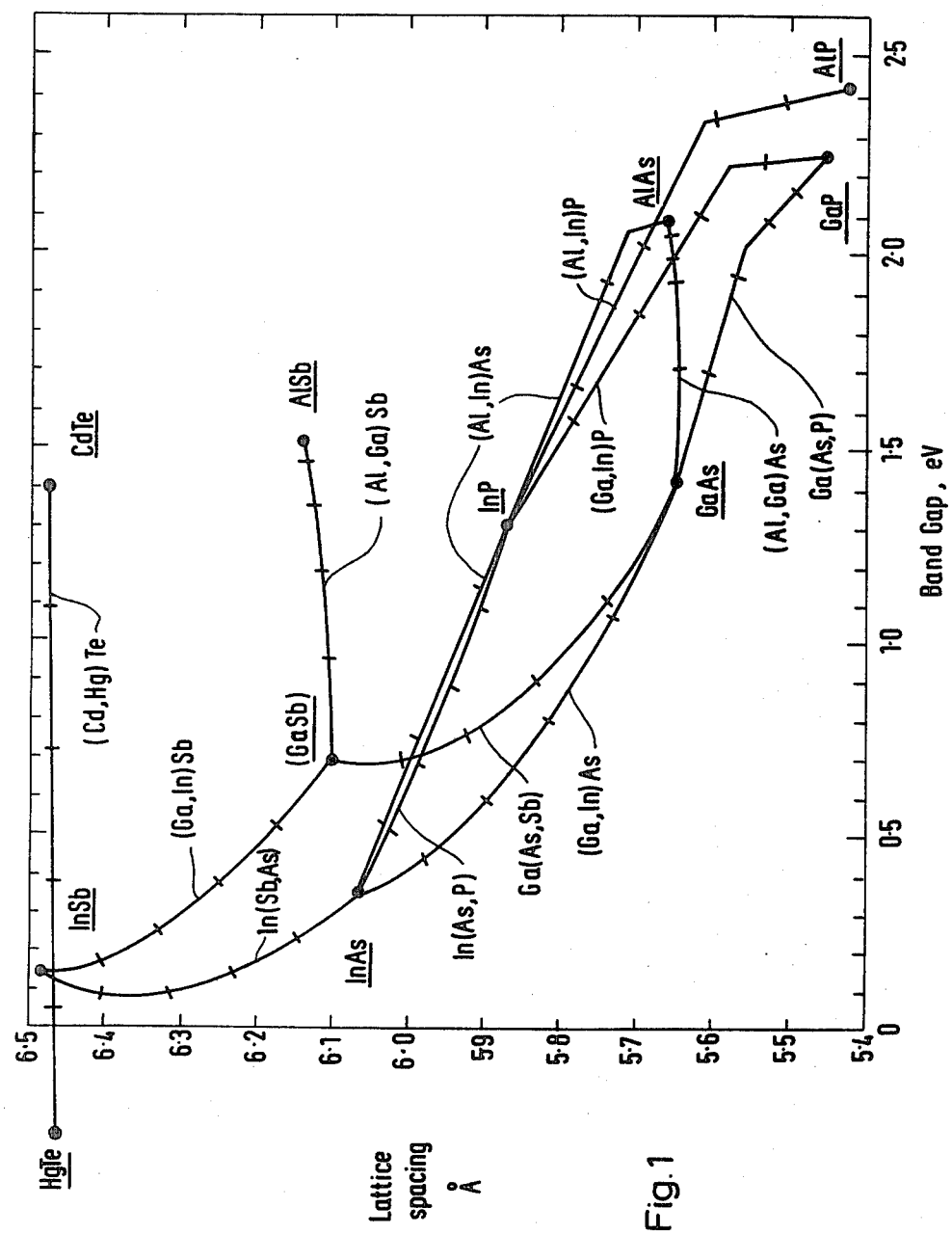
FIG. 1 is a graph depicting the variation of lattice spacing and band-gap with composition for a number of ternary solid solutions of compound semiconductors.

Referring to FIG. 1, and in particular to the In(Sb, As) line between In As and In Sb, the addition of progressively more In Sb to In As has the effect of progressively increasing the lattice spacing at a relatively rapid rate. The four hatchings on this line, and each of the others, mark the 20, 40, 60 and 80% points respectively. The rate of increase in lattice spacing is much more rapid than that produced by adding Al As to Ga As to form (Al, Ga)As. This shows why the growth of In(Sb, As) upon an In As substrate is much more difficult than growing (Al, Ga) As upon a substrate of Ga As.

FIG. 1 indicates that Ga Sb has the same lattice constant as a particular point on the In(Sb, As) line corresponding approximately to In($Sb_{0.1}As_{0.9}$). Therefore substantially strain free In($Sb_{0.1}As_{0.9}$) can be grown upon a Ga Sb substrate. This enables structures of the type depicted schematically in FIG. 2 to be grown. A Ga Sb substrate 20 of one conductivity type is provided, and then the material of layers 21 and 22 is grown epitaxially upon the substrate 20. Layer 21 has the same conductivity type as the substrate while layer 22 is arranged to have the opposite conductivity type in order to form a p-n junction between them. The growth may be performed by the conventional methods of compound semiconductor material epitaxy. It is preferred to use liquid phase epitaxy, and to use for this purpose a graphite slider boat system. From FIG. 1 In ($Sb_{0.1}As_{0.9}$) has a band gap of about 0.3 eV and therefore the radiation produced in the vicinity of a p-n junction formed in this material will be at a wavelength of about 4 μm.

The actual value of the emission wavelength may be shifted by going from the ternary In (Sb, As) solid solution to a quaternary or higher solid solution by increasing the proportion of In Sb and adding a further compound semiconductor material in sufficient quantity to restore the lattice spacing to its original value matching that of Ga Sb. To a first approximation the rate of change of lattice spacing and of band gap provided by adding a certain proportion of for instance GaAs to In(Sb, As) is the same as adding that proportion of Ga As to In As. In other words, referring to FIG. 1, the effect of adding Ga As to In (Sb, As) is to a first approximation given by a translation of the (Ga,In) Sb curve so that its In As end lies on the appropriate part of the In(Sb, As) curve. It is to be noted that the In(Sb, As) curve is not so steep at its lower end as the top end of the (Ga,In) Sb curve. Therefore, by increasing the proportion of In Sb in In (Sb, As) above In ($Sb_{0.1}As_{0.9}$) and then adding sufficient Ga As to restore the lattice spacing to the In($Sb_{0.1}As_{0.9}$) value, the band gap is reduced and hence the emission wavelength increased. Conversely, because the In(As, P) curve and the (Al, In) As curve are neither as steep as the In (As, Sb) curve, the compensation of additional In Sb with the appropriate amount of In P or Al P will have the effect of increasing the band gap and hence reducing the emission wavelength.

Therefore, the device of FIG. 1 may employ multicomponent, quaternary or higher, solid solution epitaxial layers 21 and 22 in order to provide a wavelength of emission greater or less than that of the ternary In(Sb, As) composition with a lattice spacing matching that of Ga Sb. This multicomponent solid solution will be one having a lattice spacing matched with that of Ga Sb and based upon the ternary In(Sb, As) system.

It will be noted that Ga Sb has a higher band gap than In(Sb, As) and therefore the heterojunction formed between the substrate 20 and layer 21 will serve to confine minority carriers. For some applications it may therefore be advantageous similarly to confine minority carriers on the opposite side of the p-n junction by the use of an additional layer (not shown in FIG. 2) of Ga Sb on top of layer 22.

By analogy with injection lasers based on (Al, Ga)As it might superficially be expected that it should be possible to construct a laser with an In(Sb, As) layer sandwiched between a pair of layers of Ga Sb. Although the two heterojunctions of such a structure are effective in confining minority carriers they do not provide the requisite optical guidance. This is because the refractive index of Ga Sb (3.83 at 4 μm) is greater than that of In As (3.51 at 4 μm) and greater than that of In(Sb, As). This problem may be resolved by the use of (Al, Ga)Sb in place of Ga Sb. FIG. 3 depicts the variation of optical frequency dielectric constant (equal to the square of the refractive index) for different compositions in the (Al, Ga)Sb solid solution. In order to provide optical confinement at a heterojunction the material bounding the active region should have a refractive index less than that of the active region, preferably about 1% less. Therefore by adding Al Sb to Ga Sb it is possible to reduce the refractive index to an acceptable value. Typically this will occur in the region of $(Al_{0.6}Ga_{0.4})Sb$. (Al, Ga)Sb appears to be more stable than (Al, Ga)As with respect to atmospheric attack, and it is found that $(Al_{0.6}Ga_{0.4})Sb$ is stable in air at room temperature. Referring again to FIG. 1, the lattice spacing of (Al, Ga)Sb and (Al, Ga)As both change with composition at substantially the same slow rate. Therefore, with an active region lattice spacing matched with that of Ga Sb, it is possible, without introducing undue strain, to vary the composition of (Al, Ga)Sb within relatively wide limits so as to adjust the strength of optical guidance to the desired value.

FIG. 4 depicts a laser which is functionally analogous with the single heterostructure (Al, Ga)As laser. The laser is grown by epitaxy upon a Ga Sb substrate 40 and includes two, or optionally three, epitaxial layers 41, 42 and 43. Layer 41 has the opposite conductivity type to that of the substrate 40, and is made of material having the same lattice spacing as the substrate and it is made of In(Sb, As) or of a multicomponent, quaternary or higher, solid solution based on In(Sb, As). Layer 42 has the same conductivity type as layer 41, and is made of (Al, Ga)Sb containing a sufficient proportion of Al Sb to reduce its refractive index beneath that of layer 41 so as to provide the requisite amount of optical confinement in addition to minority carrier confinement. Layer 43 has the same conductivity type as layer 42 and is an optional capping layer of Ga Sb which may be provided to protect the underlying layer 42 from atmospheric attack. This will be the more necessary if layer 42 contains a particularly large proportion of Al Sb which would make it more vulnerable to atmospheric attack. In this construction the heterojunction formed between the substrate 40 and layer 41 merely provides electrical confinement whereas that between layers 41 and 42 provides both electrical and optical confinement.

FIG. 5 depicts a laser which is functionally analogous with the double heterostructure (Al, Ga)As laser. This is essentially similar to that previously described with reference to FIG. 4, but includes an additional layer 50 of (Al, Ga)Sb of the same conductivity type as the substrate 40 which is located between the substrate and layer 41 which in this instance may have either conductivity type. This layer 50 is of a composition providing it with a refractive index the desired amount less than that of layer 41 to provide the requisite optical guidance. In this way electrical and optical confinement is provided at both the heterojunctions flanking the active region provided by layer 41.

The constructions depicted do not show any particular means for lateral confinement of photons or minority carriers in the active light emissive region. It will however, be readily apparent that many of the techniques developed for such confinement in relation to (Al, Ga)As solid solutions will be applicable with little or no modifications to semiconductor devices constructed in accordance with the teachings of the present invention.

While I have described above the principles of my invention in connection with specific apparatus it is to be clearly understood that this description is made only by way of example and not as a limitation to the scope of my invention as set forth in the objects thereof and in the accompanying claims.

I claim:

1. An infra-red light emissive device comprising:
   a substrate of GaSb of a first conductivity type;
   an active layer of $In(Sb_{1-y}As_y)$ of a second conductivity type grown on said substrate, wherein $y$ is selected such that lattice spacing of said layer of $In(Sb_{1-x}As_x)$ is substantially the same as the lattice spacing of said substrate of GaSb; and
   a first layer of $(Al_xGa_{1-x})Sb$ of the second conductivity type grown on said active layer of $In(Sb_{1-y}As_y)$ wherein $x$ is selected such that refractive index of said layer of $(Al_xGa_{1-x})Sb$ is lower then the refractive index of said active layer of $In(Sb_{1-x}As_x)$.

2. The infra-red light emissive device of claim 1 further including a second layer of $(Al_xGa_{1-x})Sb$ of the first conductivity type between said substrate of GaSb and said active layer of $In(Sb_{1-y}As_y)$, wherein $x$ is selected such that the refractive index of said second layer of $(Al_xGa_{1-x})Sb$ is lower then the refractive index of said active layer of $In(Sb_{1-y}As_y)$.

3. The infra-red light emissive device of claim 2 wherein the first and second conductivity type are the same.

4. The infra-red emissive device of claims 1 or 2 further including a layer of GaSb of the second conductivity type grown on said first layer of $(Al_xGa_{1-x})Sb$.

5. The infra-red light emissive device of claims 1 or 2 wherein $y$ is less than 0.9 and wherein said active layer further includes a sufficient quantity of GaAs to restore the lattice spacing of said active layer to a value of about 6.1 Å thereby reducing the band gap and increasing the emission wavelength of said device.

6. The infra-red light emissive device of claims 1 or 2 wherein $y$ is less than 0.9 and wherein said active layer further includes a sufficient quantity of a compound selected from the group consisting of InP or AlP to restore the lattice spacing of said active layer to a value of about 6.1 Å thereby increasing the band gap and reducing the emission wavelength of said device.

7. The infra-red light emissive device of claims 1 or 2 wherein $y$ is about 0.9.

8. The infra-red light emissive device of claims 1 or 2 wherein $x$ is about 0.6.

* * * * *